(12) United States Patent
Gattuso et al.

(10) Patent No.: US 7,021,954 B2
(45) Date of Patent: Apr. 4, 2006

(54) TEST CONNECTOR WITH METALLIC STIFFENER

(75) Inventors: Andrew D. Gattuso, Phoenix, AZ (US); Hsiu-Yuan Hsu, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 12 days.

(21) Appl. No.: 10/826,213

(22) Filed: Apr. 16, 2004

(65) Prior Publication Data

US 2005/0233614 A1 Oct. 20, 2005

(51) Int. Cl.
*H01R 4/50* (2006.01)
(52) U.S. Cl. ....................... 439/342; 439/331
(58) Field of Classification Search ........... 439/70–72, 439/73, 266, 330, 331, 342
See application file for complete search history.

(56) References Cited

U.S. PATENT DOCUMENTS

| 5,186,642 A | 2/1993 | Matsuoka et al. |
| 5,702,255 A | 12/1997 | Murphy et al. |
| 6,016,254 A | 1/2000 | Pfaff |
| 6,097,609 A | 8/2000 | Kabadi |
| 6,149,449 A | 11/2000 | Abe |
| 6,217,341 B1* | 4/2001 | Glick et al. .................. 439/66 |
| 6,814,602 B1* | 11/2004 | Gattuso et al. ............. 439/331 |

* cited by examiner

*Primary Examiner*—Khiem Nguyen
(74) *Attorney, Agent, or Firm*—Wei Te Chung

(57) ABSTRACT

A test connector (1) includes a base (10), a cover (20), a metallic stiffener (70), two operating members (60), and a lid (30). An opening (703) is defined in the stiffener for receiving the cover therein. Two spaced projections (704) are formed on one end of the stiffener. Two receiving grooves (705) are defined in bottoms of the projections respectively. Each operating member comprises a first operating lever (601) engaged with the receiving grooves via a first shaft (603), and a second operating lever (602) engaged with the base. The lid is engaged with the operating members for pivotably moving the first and second operating levers so that the operating members actuate the stiffener and the cover to move. When the cover moves to make the terminals connect a CPU during applying an unduly force on the lid, the metallic stiffener can protect the plastic cover from damage.

16 Claims, 6 Drawing Sheets

TEST CONNECTOR WITH METALLIC STIFFENER

BACKGROUND OF THE INVENTION

1. Field of the Invention

The present invention relates to an electrical connector such as a test socket used for testing of integrated circuit (IC) packages, and particularly to an electrical connector with a metallic stiffener that minimizes the risk of accidental damage to a cover of the connector.

2. Description of the Prior Art

Test connectors are widely used for receiving and testing of IC packages such as land grid array (LGA) chips. A conventional test connector includes a main body, and a plurality of operating levers for actuating lateral movement of the movable plate along the main body. The movable plate is movable between a released state in which the IC package is attached thereon but electrically disengaged terminals in the main body, and a contacting state in which the IC package is electrically engaged with the terminals. U.S. Pat. Nos. 5,186,642 and 5,702,255 disclose this kind of test connector.

FIG. 6 shows a conventional test connector 9. The connector 9 comprises a base 91, a cover 92, a pair of operating members 95, a pair of coil springs 94, a pair of inserting plates 96, and a lid 93. Each operating member 95 comprises a pair of operating levers 950 each defining a receiving hole 951 and a guiding groove 952, a pair of supporting shafts 954 received in the receiving holes 951, and a pair of transmission shafts 955 received in the guiding grooves 952. The base 91 comprises a main body (not labeled) defining a plurality of passageways 910 receiving a plurality of terminals 9 (not shown) therein. The base 91 defines a pair of blind holes 914 for receiving the coil springs 94. Each of opposite ends of the main body defines a pair of retaining grooves 912, for receiving the supporting shafts 954 of the operating members 95. The cover 92 defines a plurality of passages 920 in a main portion thereof, corresponding to the passageways 910 of the base 91. The cover 92 comprises four projections 922 protruding upwardly from four corners thereof. A pair of elongated receiving grooves 924 is defined in opposite ends of the cover 92 respectively, at the projections 922. The receiving grooves 924 are provided for receiving the transmission shafts 955 of the operating members 95. The lid 93 is substantially a rectangular frame, and defines a central opening 930. A pair of receiving recesses (not shown) is defined in bottoms of opposite sidewalls 932 of the lid 93 respectively, for receiving corresponding inserting plates 96 therein.

Referring also to FIG. 7, in assembly, the cover 92 is movably mounted on the base 91. The supporting shafts 954 of the operating members 95 are pivotably received in the retaining grooves 912 of the base 91, and the transmission shafts 955 of the operating members 95 are pivotably received in the receiving grooves 924 of the cover 92. The inserting plates 96 are mounted on the operating members 95, and are fixed in the recesses of the lid 93. The coil springs 94 are mounted between the base 91 and the lid 93. The lid 93 is thereby engaged with the operating members 95 and movably mounted on the base 91.

In use, the lid 93 is pushed downwardly by a robot or an operator's hand (not shown), with corresponding force being applied to the operating members 95. The operating members 95 drive the cover 92 to move horizontally in a direction toward one of the ends of the base 91 via the transmission shafts 955. When the lid 93 has reached a bottommost position, the coil springs 94 are compressed, and the cover 92 is urged to be in an open state. In the open state, an IC package (not shown) can be attached on the cover 92, with leads of the IC package passing through the passages 920 of the cover 92 and being received in the passageways 910 of the base 91 with zero insertion force (ZIF). That is, when the IC package is attached on the cover 92 in the open state, the leads of the IC package are not in mechanical or electrical engagement with the terminals of the base 91. When the downward pushing by the robot or the operator's hand is released, the coil springs 94 decompress, and the cover 92 is driven horizontally in an opposite direction toward its original position. The leads of the IC package thereby mechanically and electrically engage with the terminals of the base 91. In this position, the cover 92 is secured to be in a closed state.

In the conventional connector 9, if a downward force pushing on the lid 93 is insufficient, the cover 92 is driven only part of the way toward the open state. When the IC package is then attached on the cover 92, the leads of the IC package are received in the passageways 910 and interfere with the terminals of the base 91. The leads and the terminals are thus liable to sustain damage. In addition, even when the downward force is sufficient, the shafts 955 are driven to respective endmost portions of the guiding grooves 952, whereat respective walls of the operating levers 950 apply forces on the shafts 955. Smooth movement of the shafts 955 is retarded and interrupted by such forces. Thus, smooth movement of the cover 92 along the base 91 is disrupted, which can result in damage to the leads of the IC package and the terminals of the base 91. Furthermore, in the open state, if the downward force is released suddenly, the coil springs 94 rapidly decompress and drive the lid 93 upwardly, and the cover 92 is quickly driven to the closed state. When this happens, the leads of the IC package enter the terminals of the base 91 with great speed and force, and the leads and the terminals are liable to sustain damage.

In addition, When the downward force applied on the lid 93 is unduly great, the force will be delivered to the cover 92 via the transmission shafts 955. Because the cover 92 is commonly formed from plastic material and only a part of the cover 92 obtains the force, such great force will make the cover 92 crack. When this happens, accurate and reliable engagement between the terminals and the leads of the IC package is decreased.

Therefore, a new test connector which overcomes the above-mentioned problems is desired.

SUMMARY OF THE INVENTION

An object of the present invention is to provide a test connector for electrically testing an electronic package such as an LGA chip, whereby the test connector is configured to minimize the risk of damage to leads of an associated electronic package.

Another object of the present invention is to provide a test connector configured so that terminals of the connector can accurately engage with the associated electronic package.

To achieve the above objects, a test connector in accordance with a preferred embodiment of the present invention is for electrically testing an electronic package such as a land grid array (LGA) chip. The connector comprises a base, a cover movably mounted on the base, a metallic stiffener engaged with the cover, a pair of operating members, a lid, four coil springs received between the lid and the base, and a pair of inserting plates. The base defines a plurality of passageways receiving a plurality of conductive terminals therein. The cover defines a plurality passages corresponding to the passageways of the base, for making leads of an IC package pass through the passages and be received in the passageways to engage with the terminals. The metallic stiffener is a substantially rectangular frame, and has a first side, a second side opposite to the first side, two opposite three sides connecting the first and second sides respectively, and a central opening disposed between the sides, the opening for receiving the cover therein. A pair of spaced, aligned projections is formed on two opposite ends of the first side. A pair of receiving grooves is defined in bottoms of the projections respectively. Each operating member comprises a first operating lever engaged with the receiving grooves of the stiffener via a first shaft of the operating member, and a second operating lever engaged with the base. The first and second operating levers are pivotably attached to their respective inserting plates, and the inserting plates are mounted to the lid respectively. The lid is thereby disposed above the operating members for pivotably moving the first and second operating levers.

When no external force is exerted on the lid of the connector, the terminals in the base permit zero insertion force insertion and removal of the leads of the IC package, and when the lid is vertically pushed down by an external force, the first levers of the operating member actuate the frame to move horizontally in a direction toward one of the ends of the base, and the inner face of the first sidewall will drive the cover relative to the base thereby connecting the terminals with leads of the IC package. With the metallic stiffener configuration, the force is directly transmitted to the stiffener instead of the cover via the first lever of the operating member, and the stiffener drives the cover move relative to the base to make the terminals engage with the leads of the IC package. This protects the plastic cover from distortion or damage should the force be unduly great. This helps ensure that engagement between the connector and the IC package is accurate and reliable.

Other objects, advantages and novel features of the invention will become more apparent from the following detailed description when taken in conjunction with the accompanying drawings, in which:

DESCRIPTION OF THE PREFERRED EMBODIMENT

Reference will now be made to the drawings to describe the present invention in detail.

Figure 1:
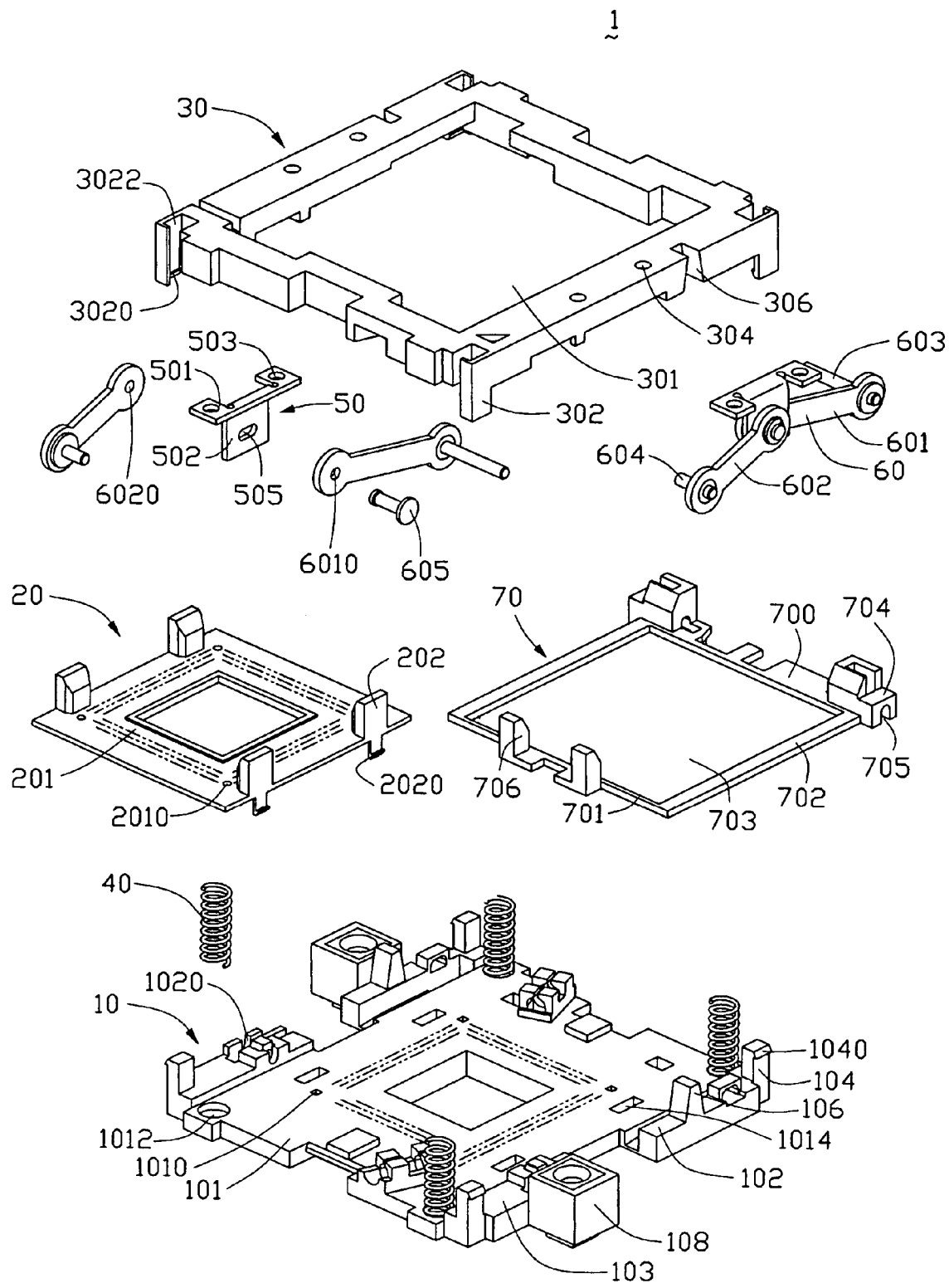
FIG. 1 is a simplified, exploded, isometric view of a test connector in accordance with the preferred embodiment of the present invention.

Referring to FIG. 1, a test connector 1 in accordance with the preferred embodiment of the present invention is adapted for receiving an integrated circuit (IC) package such as a central processing unit (CPU) (not shown) in order to test the CPU. The test connector 1 comprises a generally rectangular base 10, with a plurality of terminals (not shown) received therein, fixed on a circuit substrate such as a printed circuit board (PCB) (not shown), a generally rectangular cover 20 slidably mounted on the base 10, a metallic stiffener 70 engaged with the cover 20, a lid 30, four coil springs 40 received between the lid 30 and base 10, a pair of inserting plates 50, and a pair of operating members 60 for actuating horizontal movement of the frame 70 and the cover 20.

The base 10 includes a rectangular main portion 101, a pair of first side portions 102 at opposite lateral sides of the main portion 101 respectively, and a pair of send side portions 103 also at opposite lateral sides of the main portion 101 respectively. The first side portions 102 are spaced from the corresponding second side portions 103. The main portion 101 defines a plurality of passageways 1010 for receiving the corresponding terminals therein, and four blind holes 1012 in four corners thereof for receiving the coil springs 40 respectively. A pair of spaced, aligned retaining slots 1014 is defined in each of the opposite lateral sides of the main portion 101. A pair of first latches 104 is formed on the first side portions 102 respectively, and another pair of first latches 104 is formed on the second side portions 103 respectively. Each first latch 104 has a first hook protrusion 1040 protruding outwardly from the first side portions 102. A pair of tapered tenons 106 extends upwardly from the first side portions 102 respectively. A pair of diagonally opposite columns 108 protrudes from one first side portion 102 and one second side portion 103 respectively, for fixing the base 10 on the PCB. A pair of first receiving grooves 1020 is defined in the second side portions 103 respectively, one of the first receiving grooves 1020 being adjacent one of the columns 108.

The cover 20 is formed from metallic material such as LCP (liquid crystal polymer) that can endure soldering temperatures. The cover 20 comprises a main body 201 for receiving the CPU thereon. A plurality of passages 2010 is defined in the main body 201 in a rectangular array, corresponding to the passageways 1010, for extension therethrough of a plurality of leads of the CPU. The cover 20 defines four sidewalls (not labeled) around the main body 201. Each of two opposite lateral sidewalls forms a pair of spaced, aligned latch portions 202. Each latch portion 202 has a hook portion 2020 at a bottom end thereof, corresponding to the retaining slot 1014 of the base 10.

The lid 30 is a substantially rectangular frame, and defines a central opening 301 corresponding to the main body 201 of the cover 20. The CPU is inserted and removed through the opening 301. Four blind holes (not shown) are defined in four corners of a bottom of the lid 30 respectively, corresponding to the blind holes 1012 of the base 10. Each of opposite lateral sidewalls (not labeled) of the lid 30 defines a pair of spaced first mounting holes 304, for fastening a corresponding inserting plate 50 thereunder. A pair of tapered cutouts 306 is defined in the lateral sidewalls respectively, corresponding to the tenons 106 of the base 10. A pair of second latches 302 depends from each opposite lateral sidewall, the second latches 302 corresponding to the first latches 104 of the base 10. Each second latch 302 has a second hook 3020 at a distal end thereof, the second hooks 3020 corresponding to the first hooks 1040 of the first latches 104. Each second latch 302 defines an inner guiding groove 3022, the guiding grooves 3022 receiving the first latches 104 therein.

Each inserting plate 50 comprises a horizontal top plate 501, and a vertical middle plate 502 depending from a middle of the top plate 501. A pair of second mounting holes 503 is defined in opposite ends of the top plate 501 respectively. A pivotably elongated hole 505 is defined in the middle plate 502, for hinging engagement of a corresponding operating member 60 thereat.

Each operating member 60 comprises a first operating lever 601, a second operating lever 602, a first shaft 603 engaged with the first operating lever 601, and a second shaft 604 engaged with the second operating lever 602. The first operating lever 601 defines a first through hole 6010 in an end thereof, corresponding to the pivot hole 505 of a respective inserting plate 50. The second operating lever 602 defines a second through hole 6020 in an end thereof, also corresponding to the pivot hole 505 of the respective inserting plate 50. A pivot pin 605 is used for pivotably attaching the operating member 60 to the respective inserting plate 50.

The stiffener 70 is a substantially rectangular substrate, and formed from metallic material that can endure unduly great external force. The stiffener 70 comprises a first side 700, a second side 701 opposite to the first side 700, two opposite three side 702 connecting to the first and second sides 700, 701 respectively, and a middle opening 703 disposed between the sides, for receiving the cover 20 therein. A pair of spaced, aligned projections 704 is formed on two opposite ends of the first side 700. A pair of second receiving grooves 705 is defined in bottoms of the projection 704, the second receiving grooves 705 for receiving the corresponding first shafts 603. A pair of posts 706 is formed in the middle portion of the second side 701, together with the latch portions 202, for securing the CPU on the cover 20.

Figure 2:
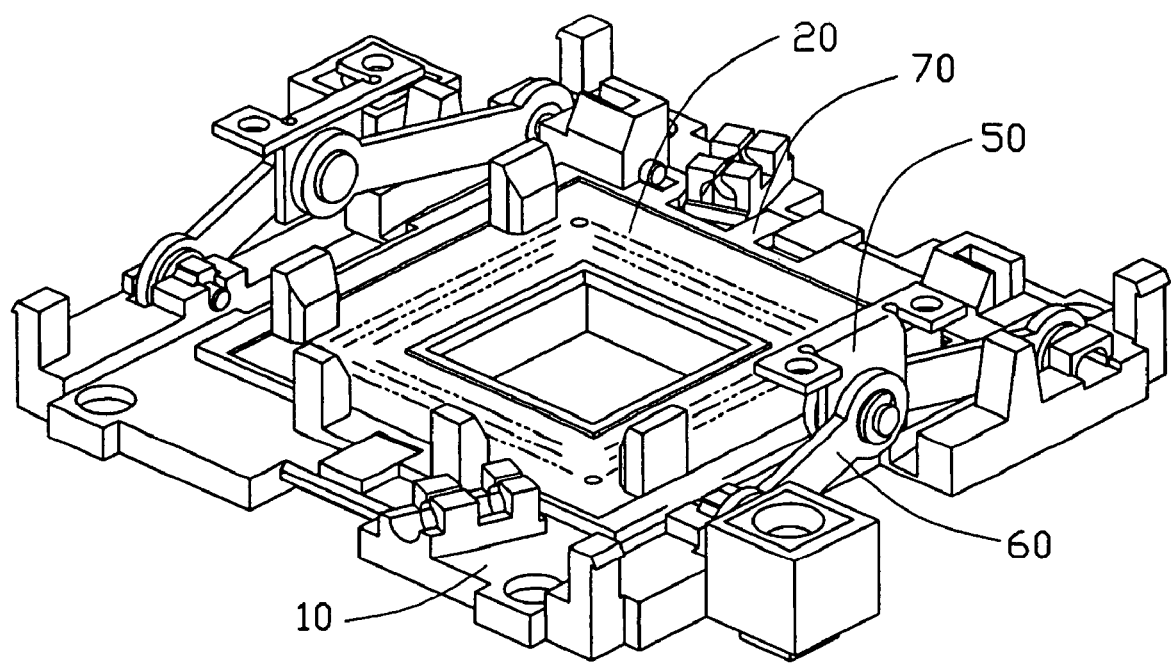
FIG. 2 is an assembled view of FIG. 1, but not showing a lid of the test connector.
Figure 3:
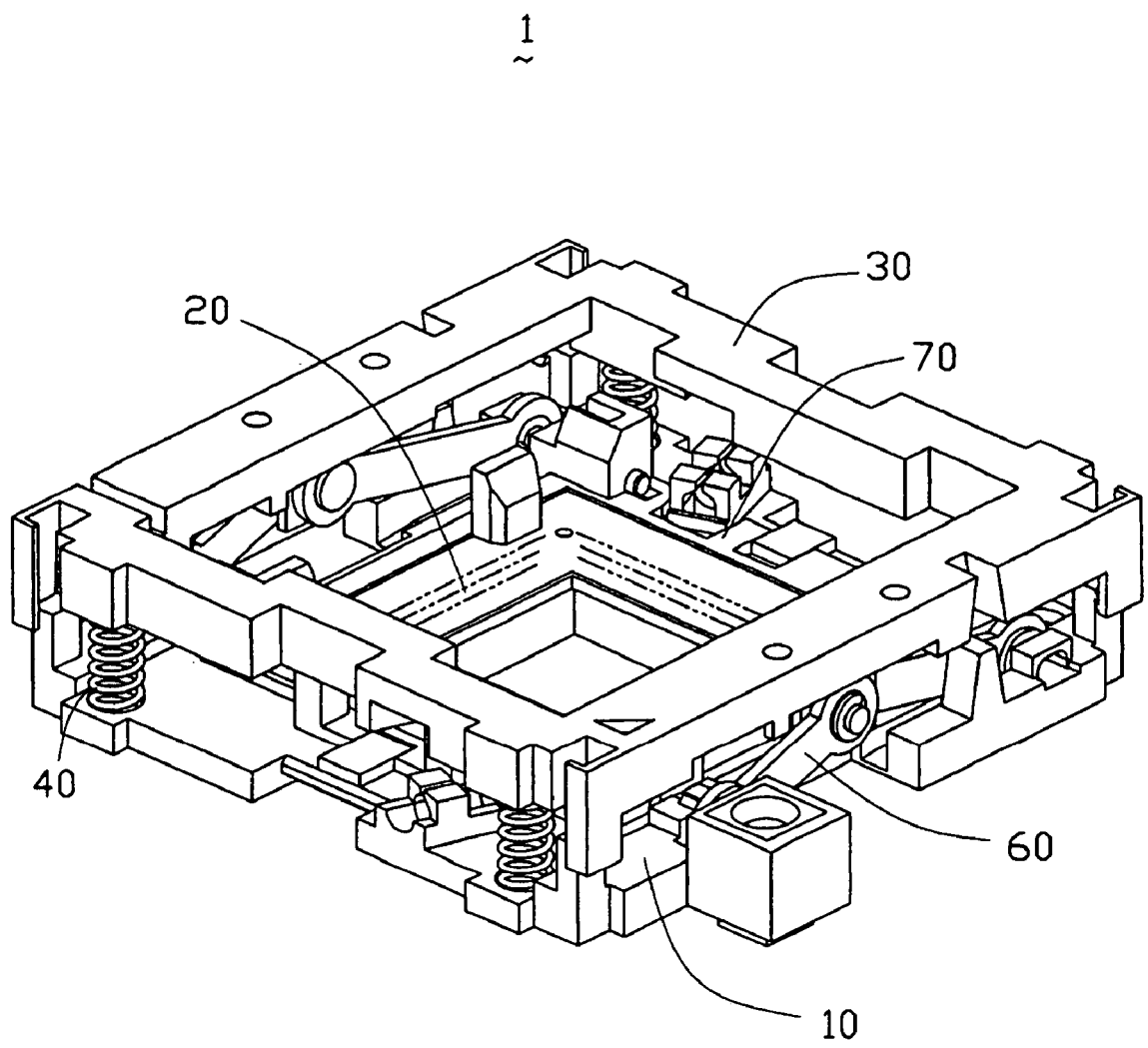
FIG. 3 is a completely assembled view of FIG. 1.

Referring to FIGS. 2 and 3, in assembly, the stiffener 70 is placed on the base 10, and the cover 20 is received in the middle opening 703 of the stiffener 70 via the hook portion 2020 of the cover 20 inserting into the retaining slot 1014 of the base 10. The second shafts 604 of the operating members 60 are pivotably received in the second receiving grooves 1020 of the base 10, and the first shafts 603 of the operating members 60 are pivotably received in the first receiving grooves 705 of the stiffener 70. The first and second operating levers 601, 602 are pivotably attached to their respective inserting plates 50 by respective pivot pins 605. The inserting plates 50 are mounted to undersides of the lateral sidewalls of the lid 30 respectively. The coil springs 40 are mounted between the lid 30 and the base 10. The lid 30 is thereby disposed above the operating members 60, and movably engaged on the base 10. The lid 30 is vertically movable relative to the base 10.

Figure 4:
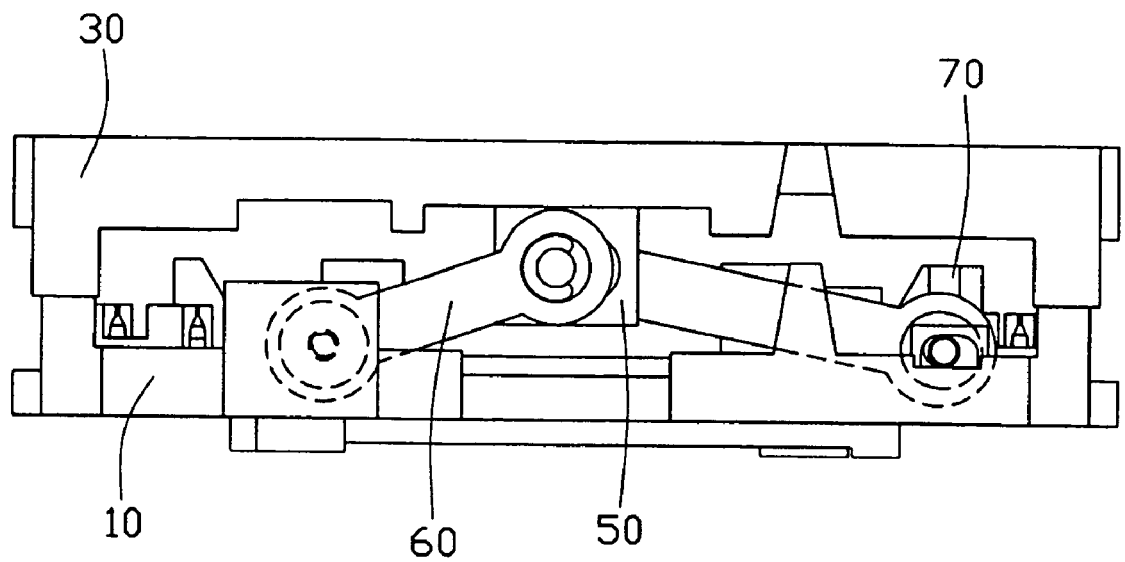
FIG. 4 is a side elevation view of FIG. 3, showing a frame and a pair of operating members of the test connector in respective first positions.

Referring to FIG. 4, the test connector 1 is in a relaxed state, with the stiffener 70 and the operating members 60 defined to be in respective first positions. In use, the CPU is inserted through the opening 301 of the lid 30 and engaged on the cover 20. The leads of the CPU are received through the passages 2010 of the cover 20, and then in the passageways 1010 of the base 10 with zero insertion force (ZIF). That is, the leads of the CPU do not connect the terminals (not shown) received in the base 10.

Figure 5:
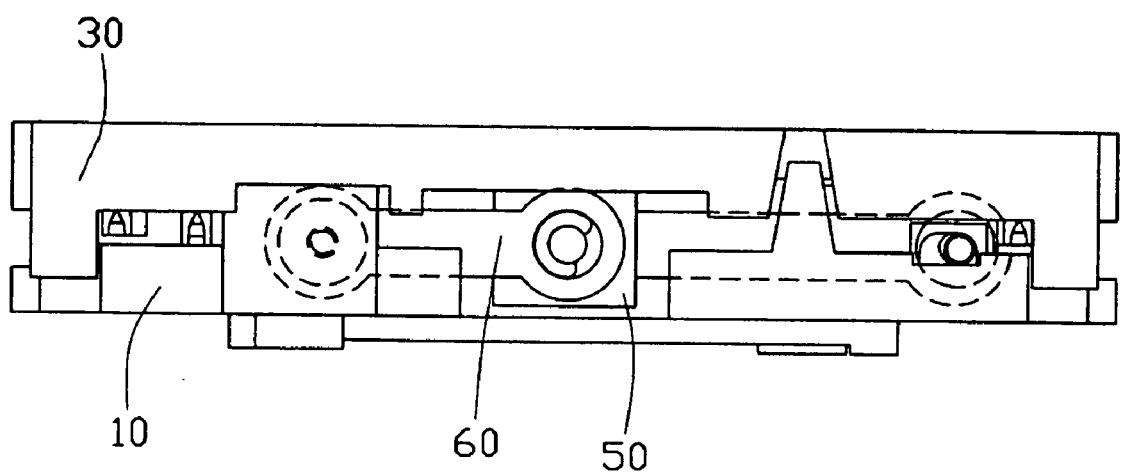
FIG. 5 is similar to FIG. 4, but showing the frame and the operating members in respective second positions.
Figure 6:
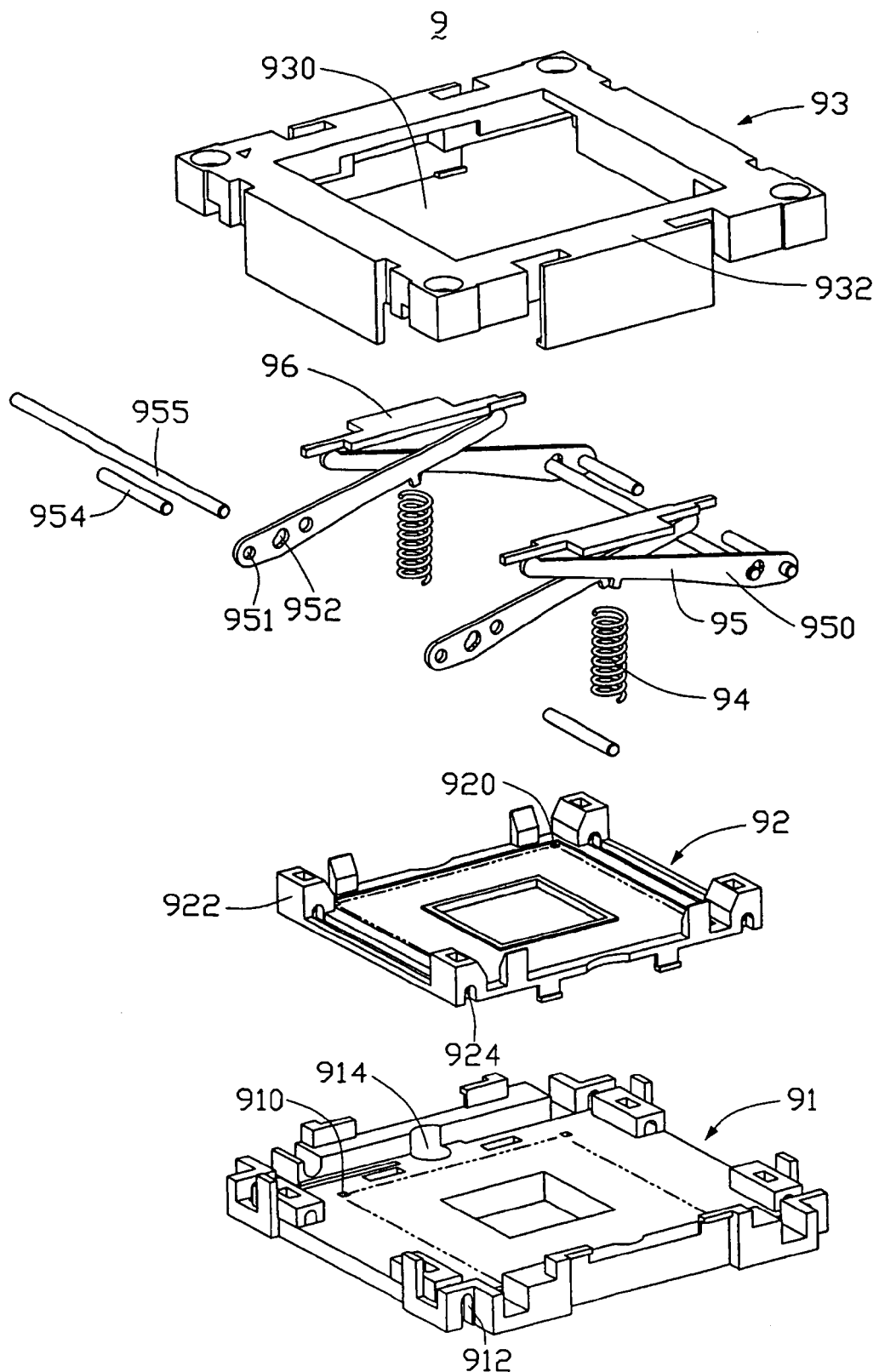
FIG. 6 is a simplified, exploded, isometric view of a conventional test connector.
Figure 7:
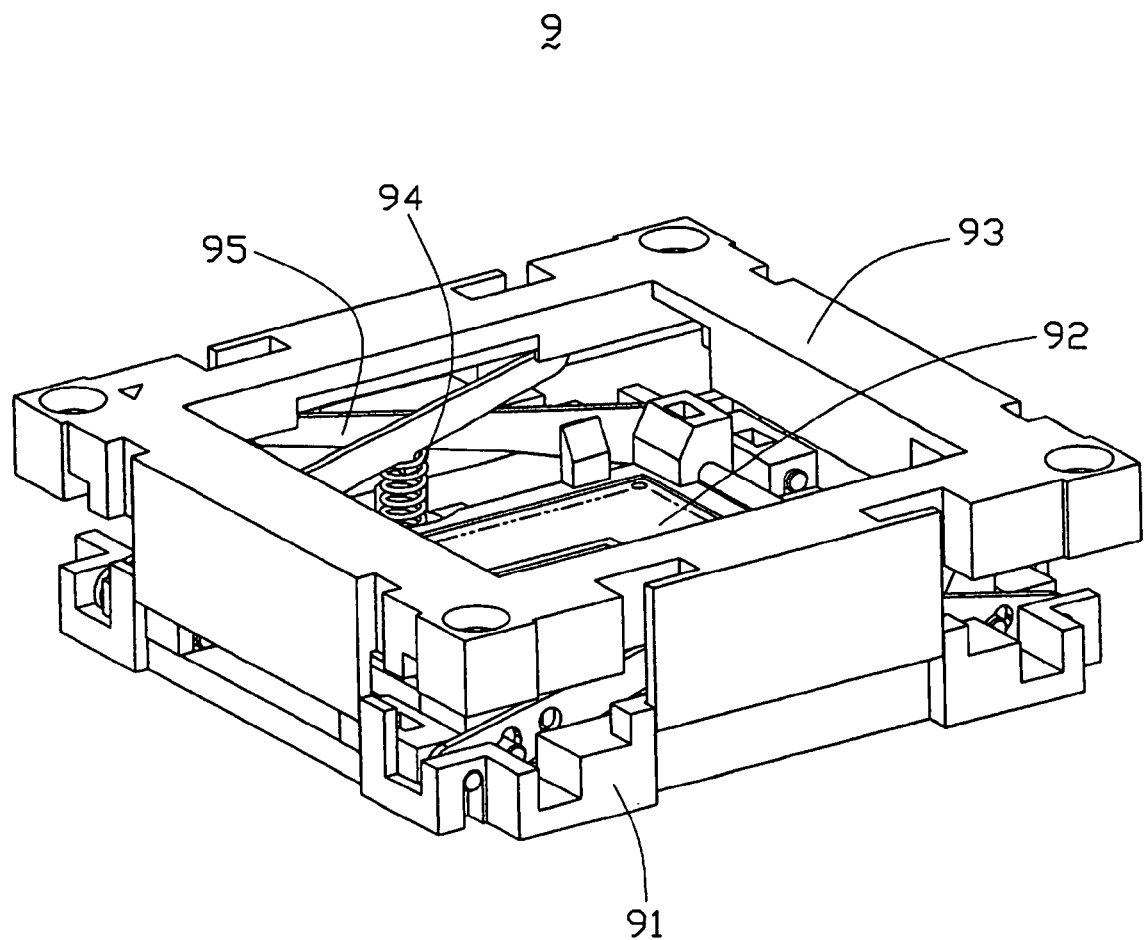
FIG. 7 is an assembled view of FIG. 6.

Referring to FIG. 5, when the lid 30 is pushed downwardly by an external force, corresponding force is applied to the first and second operating levers 601, 602. The first and second operating levers 601, 602 are pivoted downwardly about the second shafts 603, 604 at the pivot pins 605. The first and second operating levers 601, 602 cooperatively translate such pivotal movement into horizontal force acting on the first shafts 603. Thus, the first shafts 603 drive the stiffener 70 to slide in a horizontal direction toward one end of the base 10, the inner face of the second side 701 drives the cover 20 to slide in the same direction from the first position to a second position in which the leads of the CPU engage with the terminals of the base 10. When the stiffener 70 and the cover 20 slide from the first position to the second position, the coil springs 40 are compressed. In addition, the tenons 106 of the base 10 are received in the cutouts 306 of the lid 30, thereby preventing lateral movement of the lid 30 relative to the base 10. When the downward force is released, the coil springs 40 decompress and drive the lid 30 upwardly. The first shafts 603 accordingly drive the stiffener 70 and the cover 20 to slide back from the second position to the first position.

The test connector 1, unlike conventional test connectors, provides for insertion of the leads of the CPU into the passageways 1010 of the base 10 when the test connector 1 is in a relaxed state. That is, when the cover 20 is in the first position, this ensures that the leads of the CPU are received in the passageways 1010 of the base 10 with ZIF. Similarly, after testing of the CPU, the test connector 1 is returned to the first position by decompression of the coil springs 40, this ensures that the leads of the CPU can be removed from the passageways 1010 with zero removal force. Thus, the leads of the CPU are protected from damage during both engagement and disengagement on and from the test connector 1. In addition, if the downward force applied on the lid 30 is insufficient, the stiffener 70 and the cover 20 are driven only part of the way toward the closed state. Because the CPU is already attached on the cover 20, the leads of the CPU do not sustain damage when they are only partly engaged with the terminals of the base 10. Furthermore, if the downward force applied on the lid 30 is unduly great, the unduly great force will translate the cover 20 via the first shafts 603 and the stiffener 70. Because the stiffener 70 is formed metallic material, the cover 20 made in plastic material do not sustain damage. Thus, the cover 20 is protected from damage via the stiffener 70. Moreover, in closed state, if the downward force is released suddenly, the coil springs 40 rapidly decompress and drive the lid 30 upwardly, and the cover 20 is quickly driven to the open state via the stiffener 70 and the first shafts 603. When this happens, the leads of the CPU exit the terminals of the base 10. Rapid exiting of the leads from the terminals is less likely to cause damage thereto compared with rapid entering of the leads into the terminals as in conventional art. Also, the cover 20 is protected because the stiffener 70 connecting the lid 30 via the operating members 60 during the sudden downward force decompressed. Finally, the second shafts 604 are pivotably engaged with the base 10, while the first shafts 603 are pivotably engaged with the stiffener 70, and the stiffener 70 connects the cover 20. Thus, the above-described sliding of the stiffener 70 and the cover 20 relative to the base 10 can be performed smoothly and easily without retardation or interruption.

Although the present invention has been described with reference to particular embodiment, it is not to be construed as being limited thereto. Various alterations and modifications can be made to the embodiment without in any way departing from the scope or spirit of the present invention as defined in the appended claims.

What is claimed is:

1. An electrical connector for receiving an integrated circuit (IC) package, the connector comprising:
 a base defining a plurality of passageways with a plurality of conductive terminals received therein;
 a cover slidably mounted on the base, the cover comprising two opposite sidewalls thereof;
 a metallic stiffener engaged with the cover;

at least one operating member for actuating the cover to move relative to the base, the at least one operating member comprising a pair of operating levers, one of the operating levers engaged with the stiffener and the other operating lever engaged with the base;

a lid engaged with the at least one operating member for pivotably moving the operating levers; and a plurality of coil springs connected between the lid and the base;

wherein when an up-and-down movement of the operating member causes a pivoting movement of the operating lever to move the stiffener and the cover back-and-forth relative to the base thereby disconnecting and connecting the terminals with the leads of the IC package during applying an unduly force on the lid, one of the sidewalls of the cover attaches an inner face of the stiffener causing the stiffener to protect the plastic cover from damage due to a proportion of the cover undergoing too great a force.

2. The electrical connector as claimed in claim 1, wherein the stiffener is a substantially rectangular frame and comprises four sides and a central opening disposed between the sides for receiving the cover therein.

3. The electrical connector as claimed in claim 2, wherein one of the sides defines a pair of spaced, aligned projections on two opposite ends thereof, and the opposite side defines a pair of posts in a middle portion thereof.

4. The electrical connector as claimed in claim 3, wherein a pair of first receiving grooves is defined in bottoms of the projections respectively.

5. The electrical connector as claimed in claim 1, further comprising a pair of inserting plates mounted to the lid, and a pair of operating members pivotably mounted to the corresponding inserting plates.

6. The electrical connector as claimed in claim 5, wherein each operating member comprises a first shaft engaged with the receiving groove of the stiffener, a second shaft engaged with the base, a first operating lever attached to the first shaft, and a second operating lever mounted to the second shaft.

7. The electrical connector as claimed in claim 1, wherein the base comprises four first latches each having a first hook, and the lid comprises four second latches each having a second hook, the second latch and the second hook respectively corresponding to the first latch and the first hook.

8. The electrical connector as claimed in claim 7, wherein a pair of tenons is formed on the base, and a pair of cutouts is defined in the lid, the tenons engaged with the cutouts thereby restraining the lid to move only in a vertical direction.

9. The electrical connector as claimed in claim 1, wherein the base comprises a main portion defining four retaining slots, and four blind holes for receiving the coil springs.

10. The electrical connector as claimed in claim 9, wherein the base comprises a pair of second receiving grooves for receiving the second shafts of the operating members.

11. A connector for receiving and testing a central processing unit (CPU), the connector comprising:

a base defining a plurality of passageways with a plurality of conductive terminals received therein;

a cover slidably mounted on the base;

a metallic stiffener engaged with the cover;

a pair of operating members actuating the stiffener and the cover to move relative to the base, each of the operating members comprising a first operating lever engaged with the stiffener and a second operating lever engaged with the base;

a lid movably engaged with the base;

a pair of inserting plates fastened to the lid and pivotably engaged with the operating members, thereby the lid engaged with the operating members for pivotably moving the first and second operating levers; and a plurality of coil springs connected between the base and the lid;

wherein when an up-and-down movement of the operating member causes a pivoting movement of the operating lever to move the stiffener and the cover back-and-forth relative to the base thereby disconnecting and connecting the terminals with the leads of the CPU during applying an unduly force on the lid, the cover attaches an inner face of the stiffener causing the stiffener to protect the plastic cover from damage due to a proportion of the cover undergoing too great a force.

12. The connector as claimed in claim 11, wherein the stiffener is a substantially rectangular frame and comprises four sides and a central opening disposed between the sides for receiving the cover therein.

13. The connector as claimed in claim 12, wherein one of the sides defines a pair of spaced, aligned projections on two opposite ends thereof, and the opposite side defines a pair of posts in a middle portion thereof.

14. The connector as claimed in claim 13, wherein a pair of first receiving grooves is defined in bottoms of the projections respectively.

15. The connector as claimed in claim 11, wherein the operating member comprises a first shaft engaged with the first operating lever, and a second shaft engaged with the second operating lever.

16. The connector as claimed in claim 15, wherein the first shafts of the operating members are received in the first receiving grooves of the stiffener, and the base defines a pair of second receiving grooves for receiving the second shafts of the operating members.

* * * * *